United States Patent [19]

Fruitman

[11] Patent Number: 5,769,691

[45] Date of Patent: Jun. 23, 1998

[54] METHODS AND APPARATUS FOR THE CHEMICAL MECHANICAL PLANARIZATION OF ELECTRONIC DEVICES

[76] Inventor: Clinton O. Fruitman, 3 N. Galaxy Dr., Chandler, Ariz. 85226

[21] Appl. No.: 662,678

[22] Filed: Jun. 14, 1996

[51] Int. Cl.⁶ ........................................................ B24B 7/00
[52] U.S. Cl. ............................ 451/41; 451/287; 451/533; 451/526
[58] Field of Search ................................. 451/36, 41, 285, 451/286, 287, 288, 526, 530, 533

[56] References Cited

U.S. PATENT DOCUMENTS

| | | | |
|---|---|---|---|
| 4,805,348 | 2/1989 | Arai et al. | 51/118 |
| 5,069,002 | 12/1991 | Sandhu et al. | 451/287 |
| 5,099,614 | 3/1992 | Arai et al. | 51/165 |
| 5,329,732 | 7/1994 | Kalsrud et al. | 51/131.5 |
| 5,435,772 | 7/1995 | Yu | 451/41 |
| 5,486,129 | 1/1996 | Sandhu et al. | 451/287 |
| 5,489,233 | 2/1996 | Cook et al. | 451/41 |
| 5,498,196 | 3/1996 | Kalsrud et al. | 451/11 |
| 5,498,199 | 3/1996 | Karlsrud et al. | 451/289 |
| 5,534,106 | 7/1996 | Cote et al. | 451/287 |
| 5,536,202 | 7/1996 | Appel et al. | 451/285 |

*Primary Examiner*—Eileen P. Morgan
*Attorney, Agent, or Firm*—Snell & Wilmer, L.L.P.

[57] ABSTRACT

A non-cellular lapping pad is employed in a chemical mechanical planarization machine in conjunction with a polishing slurry to planarize the surface of a silicon workpiece. Planarization is effected by pressing the workpiece against the pad and moving the pad relative to the workpiece in at least one direction. The pad may be constructed of a porous material capable of adsorbing and entraining the slurry, such as fused polyethylene or non-cellular urethane. The pad may also be constructed may be made of a soft material to avoid damage to integrated circuit devices present on the surface of the silicon workpiece, such as a flexibilized epoxy. The slurry is a chemically and mechanically active solution comprising abrasive particles coupled with chemically reactive agents. The abrasive particles have a size of 10–200 nanometers, and suitable particle materials include colloidal silica, cerium oxide and alumina. The chemically reactive agents comprise 5–20% by weight of the solution, and suitable agents include hydroxides and potassium fluoride.

19 Claims, 5 Drawing Sheets

METHODS AND APPARATUS FOR THE CHEMICAL MECHANICAL PLANARIZATION OF ELECTRONIC DEVICES

TECHNICAL FIELD

The present invention relates, generally, to methods and apparatus for the planarization and fine finishing of flat surfaces in the microelectronics industry and, more particularly, to the use of a substantially flat, non-cellular pad in a chemical mechanical planarization (CMP) process.

BACKGROUND ART AND TECHNICAL PROBLEMS

Chemical mechanical planarization ("CMP") is widely used in the microelectronics industry. A typical CMP process involves polishing back built up insulating layers of insulators or conductors on integrated circuit chips during manufacture.

More particularly, a resinous polishing pad having a cellular structure is employed in conjunction with a slurry, for example a water-based slurry comprising colloidal silica particles. When pressure is applied between the polishing pad in the workpiece (e.g., silicon wafer) being polished, mechanical stresses are concentrated on the exposed edges of the adjoining cells in the cellular pad. Abrasive particles within the slurry concentrated on these edges tend to create zones of localized high stress at the workpiece in the vicinity of the exposed edges of the polishing pad. This localized pressure creates mechanical strain on the chemical bonds comprising the surface being polished, rendering the chemical bonds more susceptible to chemical attack or corrosion (e.g., stress corrosion). Consequently, microscopic regions are removed from the surface being polished, enhancing planarity of the polished surface. See, for example, Arai, et al., U.S. Pat. No. 5,099,614, issued March 1992; Karlsrud, U.S. Pat. No. 5,498,196, issued March 1996; Arai, et al., U.S. Pat. No. 4,805,348, issued February 1989; Karlsrud et al., U.S. Pat. No. 5,329,732, issued July 1994; and Karlsrud et al., U.S. Pat. No. 5,498,199, issued March 1996. For a further discussion of presently known lapping and planarization techniques. By this reference, the entire disclosures of the foregoing patents are hereby incorporated herein.

Presently known polishing techniques are unsatisfactory in several regards. For example, as the size of microelectronic structures used in integrated circuits decreases, and further as the number of microelectronic structures on current and future generation integrated circuits increases, the degree of planarity required increases dramatically. For example, the high degree of accuracy of current lithographic techniques or smaller devices requires increasingly flatter surfaces. Presently known polishing techniques are believed to be inadequate to produce the degree of planarity and uniformity across the relatively large surfaces of silicon wafers used in integrated circuits, particularly for future generations.

Presently known polishing techniques are also unsatisfactory in that the cellular structure of the polishing pad tends to generate heat at the interface between the pad and the workpiece. The presence of heat is problematic in that it tends to dry the slurry in the vicinity of large workpiece centers. As a polishing pad moves radially inward across the surface of a circular wafer, it has been observed that the slurry can dehydrate unevenly across the surface of the workpiece. Consequently, the polishing effect of the pad can be nonuniform across the surface of the workpiece, resulting in non-uniform planarization effects.

Chemical mechanical planarization techniques and materials are thus needed which will permit a higher degree of planarization and uniformity of that planarization over the entire surface of integrated circuit structures.

SUMMARY OF THE INVENTION

In accordance with a preferred exemplary embodiment of the present invention, a chemical mechanical planarization process employs a non-cellular surface or pad in lieu of the traditional cellular polishing pad employed in presently known CMP processes. Such a flat or non-cellular pad dramatically reduces the number of stress concentration points over a given surface area of contact between the polishing pad and the workpiece being polished, resulting in a more uniform planarization across the workpiece surface. In accordance with a further aspect of the present invention, the use of a non-cellular pad also may have the effect of reducing the extent to which the pad bends over device topographies due to the lack of a cellular nap. In accordance with a further aspect of the present invention, to the extent the reduction in asperity density (number of stress concentration points per surface area at the polishing pad) reduces the material removal rate in the polishing process, the pressure between the polishing pad and workpiece may be increased to thereby compensate for the reduction removal rate. Inasmuch as the increased pressure will be spread out over a greater surface area of contact between the pad and the workpiece, damage to delicate microstructures may be concomitantly minimized.

In accordance with a further aspect of the present invention, the use of a noncellular or substantially flat polishing pad effectively performs a lapping function on the workpiece, to the extent contact forces are distributed over a greater area for a given applied pressure, achieving maximum flatness and planarity on the workpieces being polished.

In accordance with a further aspect of the present invention, use of a non-cellular and/or substantially flat pad in lieu of the traditional cellular polishing pads facilitates more uniform slurry distribution, reducing non-uniform effects of planarization on the finished workpieces.

BRIEF DESCRIPTION OF THE DRAWING FIGURES

The subject invention will hereinafter be described in conjunction with the appended drawing figures, wherein like numerals designate like elements, and:

DETAILED DESCRIPTION OF PREFERRED EXEMPLARY EMBODIMENTS

Figure 1:
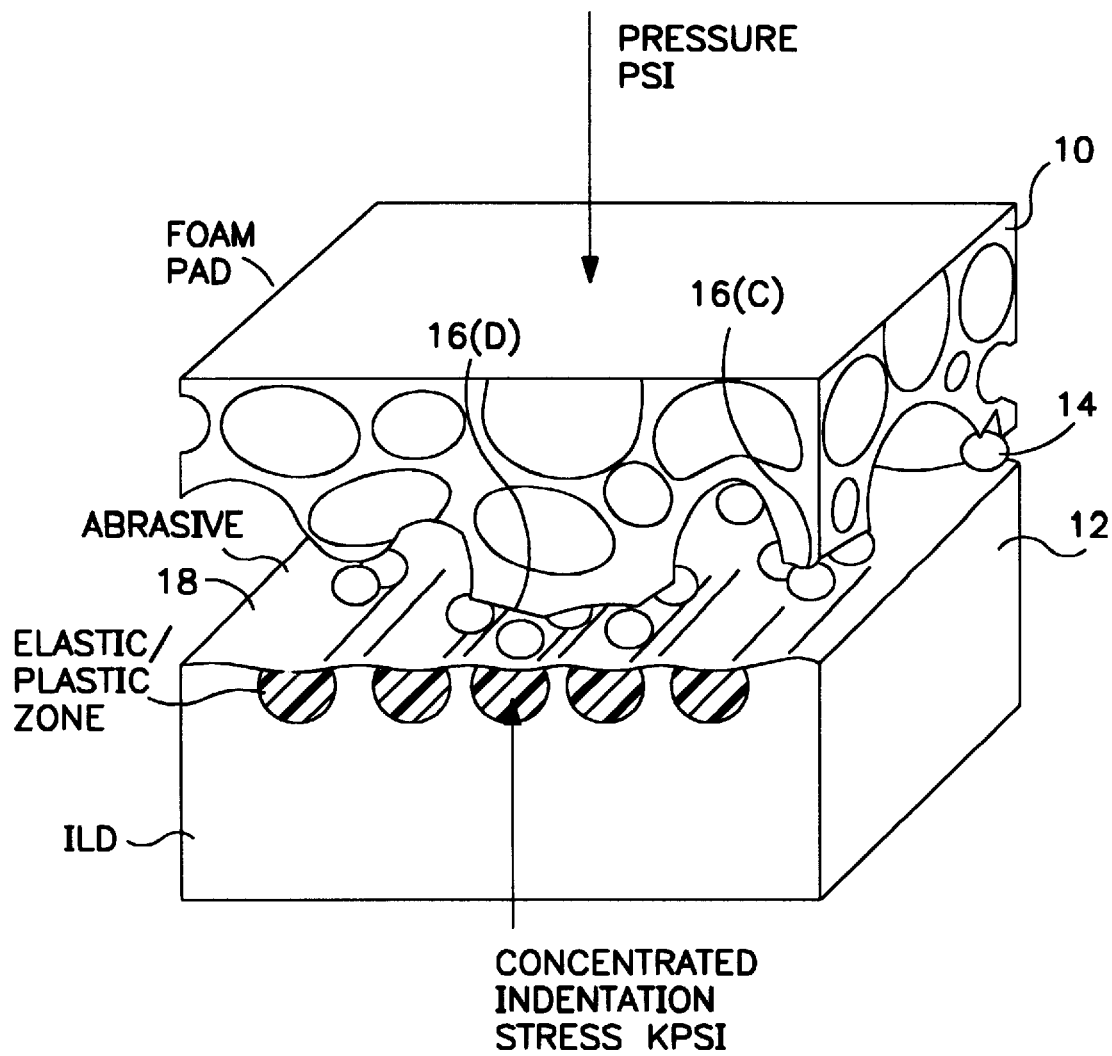
FIG. 1 is a schematic diagram of an exemplary foam polishing pad operating on an exemplary silicon workpiece in an abrasive slurry environment.

Referring now to FIG. 1, presently known CMP processes typically employ a rigid foam polishing pad 10 to polish the surface of a workpiece 12, for example an integrated circuit layer. An abrasive slurry comprising a plurality of abrasive particles 14 in an aqueous medium is employed at the interface between the pad surface and workpiece surface.

Figure 3:
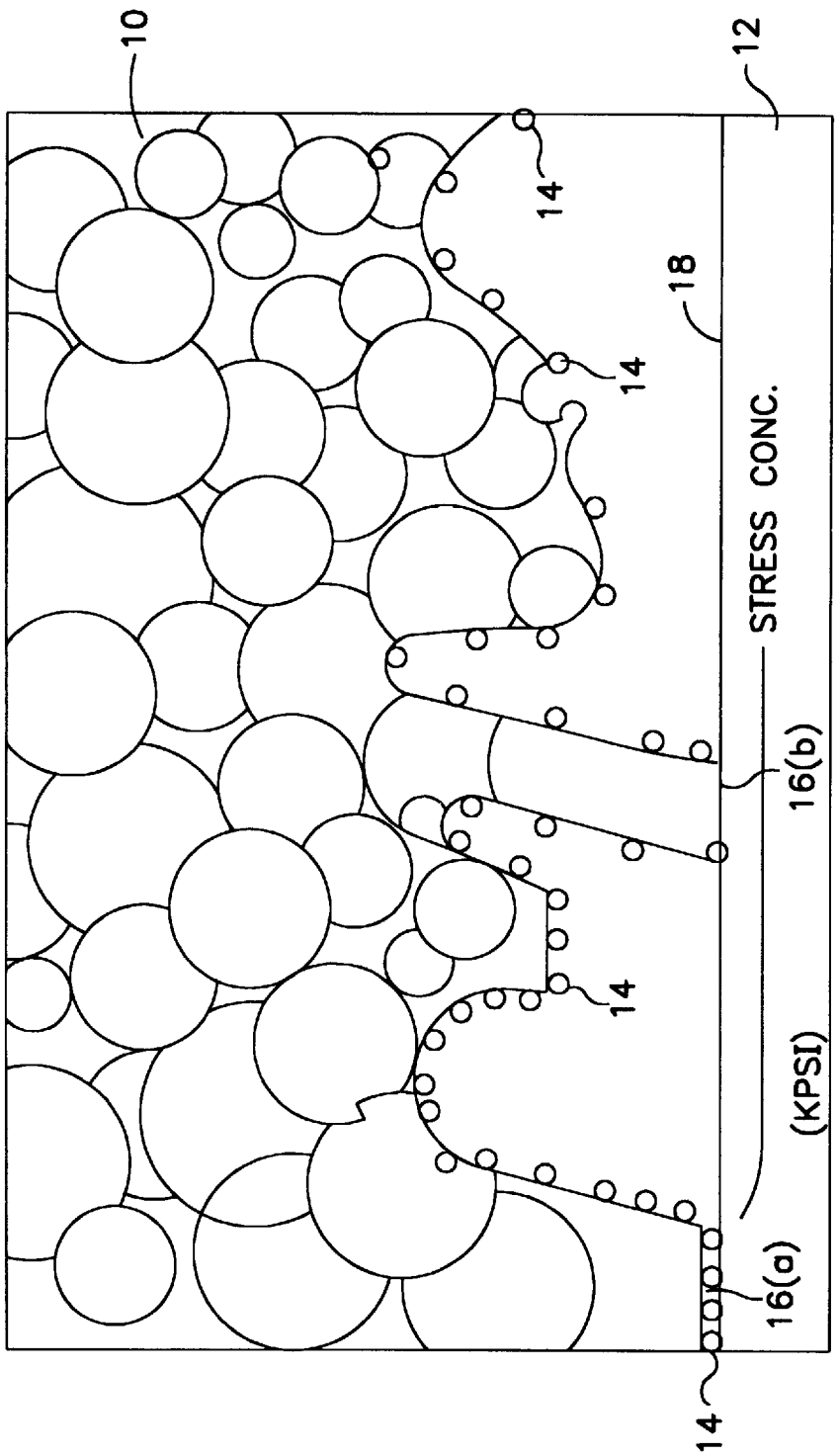
FIG. 3 is a close-up view of an exemplary known polishing pad, showing stress concentration points.

With momentary reference to FIGS. 1 and 3, cellular pad 10 comprises a large number of randomly distributed open cells or bubbles, with exposed, irregularly shaped edges forming the junction between cells. Those edge surfaces 16 which come into contact with surface 18 of workpiece 12 are known as asperities, and support the load applied to pad 10 which results in frictional forces between pad 10 and workpiece 12 as pad 10 is moved laterally (e.g., in a circular planatary manner) with respect to workpiece 12 during the polishing process.

With continued reference to FIGS. 1 and 3, abrasive particles 14 within the slurry are urged onto surface 18 of workpiece 12 by asperities 16, creating high stress concentrations at the contact regions between asperities 16 and surface 18. Thus, FIG. 1 illustrates some of the principle mechanical phenomena associated with known CMP processes.

Figure 2:
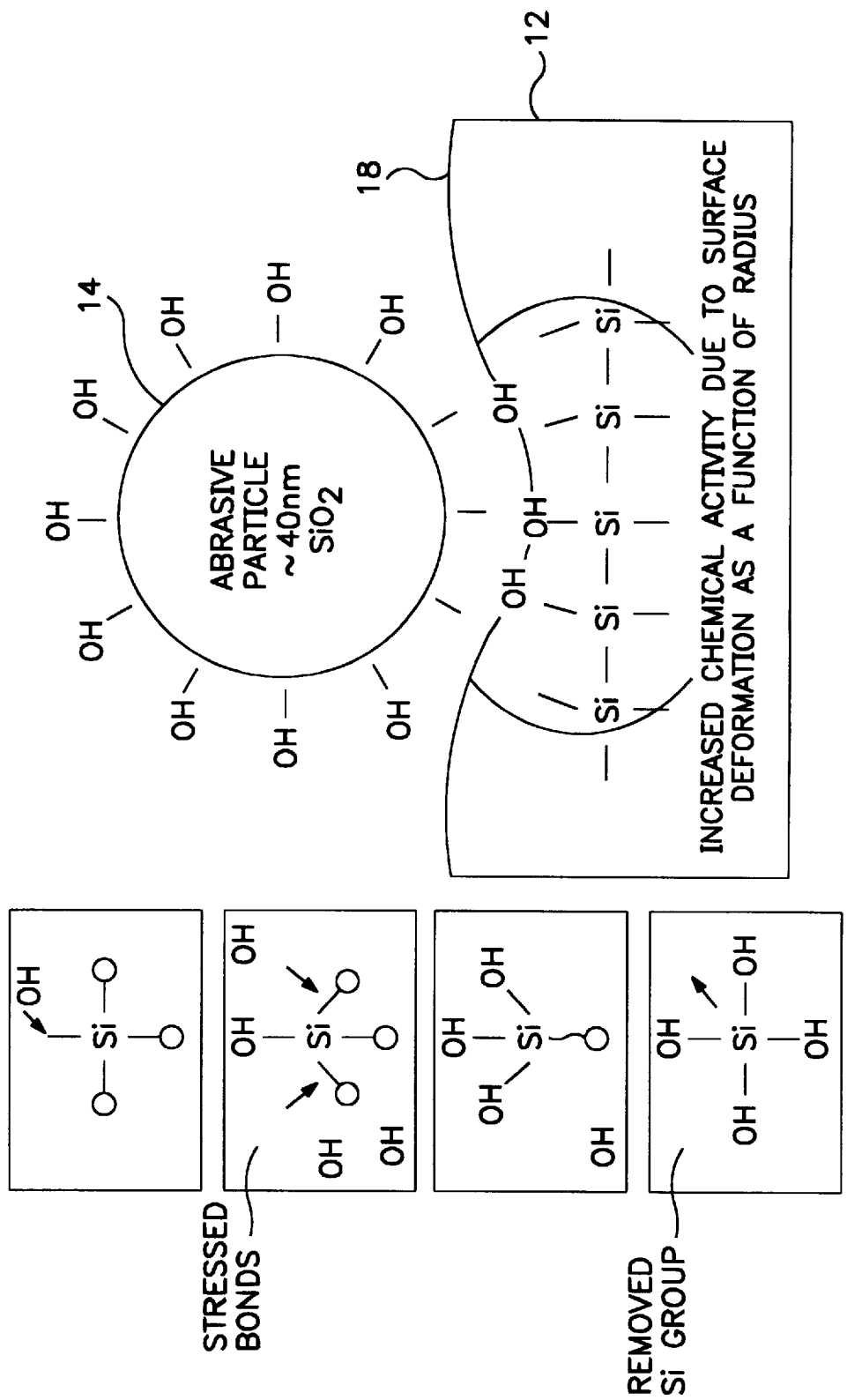
FIG. 2 is a concept diagram illustrating chemical aspects of a traditional chemical mechanical planarization process.

Referring now to FIG. 2, some of the principle chemical phenomena associated with known CMP techniques are illustrated. For example, in the case of polishing silica dialectrics, an ownwardly and impressed onto surface 18 of workpiece 12 by the pad, the chemical bonds which make up the structure of that layer of workpiece 12 in contact with pad 10 become mechanically stressed. The mechanical stress applied to these chemical bonds and their resultant strain increases the affinity of these bonds for hydroxide groups which are attached to abrasive particle 14. When the chemical bonds which comprise surface 18 of workpiece 12 are broken, silanols are liberated from surface 18 and carried away by the slurry. The liberation of these surface compounds facilitates the creation of a smooth, flat, highly planar surface 18.

In the context of a preferred embodiment of the present invention, a slurry is used to effect the chemical/mechanical polishing and planarization effects. More particularly, in the context of the present invention, a "slurry" suitably comprises a chemically and mechanically active solution, for example including abrasive particles coupled with chemically reactive agents. Suitable chemically reactive agents include hydroxides, but may also include highly basic or highly acidic ions. Suitable agents (e.g., hydroxides) are advantageously coupled to the abrasive particles within the slurry solution. In the context of a particularly preferred embodiment, suitable abrasive particles within the slurry may be on the order of 10–200 nanometers in size in the source (dry) state, and most preferably about 30–80 nanometers. This is in contrast to traditional lapping solutions, which may include abrasives having sizes in the range of 0.5–100 micrometers. Suitable slurries in the context of the present invention may also include oxidizing agents (e.g., potassium fluoride), for example in a concentration on the order of 5–20% by weight particle density, and most preferably about 11% by weight particle density.

Figure 4A:
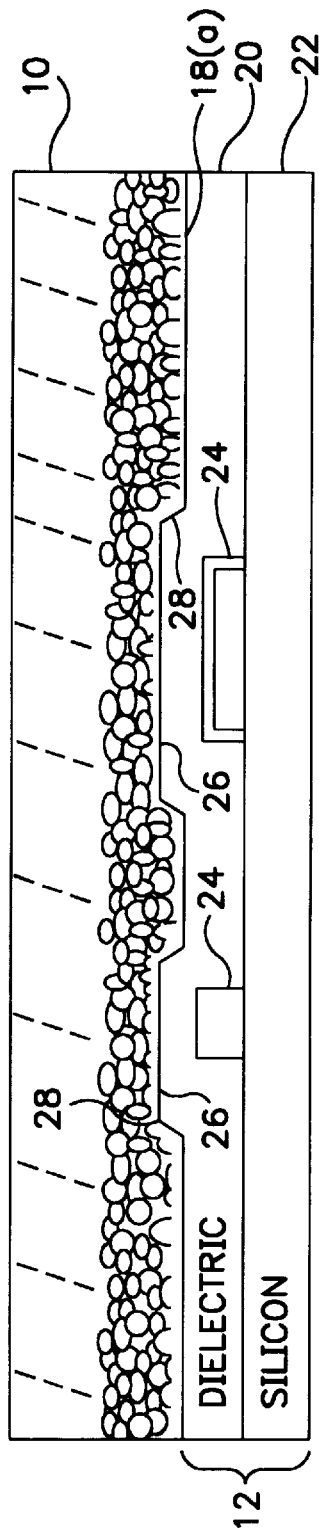
FIG. 4(a) is a schematic cross-section view of an exemplary section of an integrated circuit, showing microelectronic structures imbedded in a dielectric layer, shown in conjunction with a presently known polishing pad.

Referring now to FIGS. 3 and 4(a), an exemplary workpiece 12 suitably comprises a silicon layer 22 having microelectronic structures 24 disposed thereon (or therein). In accordance with the illustrated embodiment, microstructures 24 may comprise conductors, via holes, or the like, in the context of an integrated circuit. Workpiece 12 further comprises a dielectric layer 20 applied to the surface of silicon layer 22, which dielectric layer may function as an insulator between successive silicon layers in a multiple-layered integrated circuit.

During the semi-conductor manufacture process, dielectric 20 is placed over silicon layer 22 (and its associated electronic microstructures) in such a way that localized device topographies (e.g., ridges) 26 are formed in the dielectric layer corresponding to microstructures 24. It is these ridges, inter alia, which need to be eliminated during the CMP process to form an ideally uniform, flat, planar surface upon completion the CMP process. However, as is known in the art, present CMP techniques are not always capable of producing a sufficiently flat, planar surface, particularly for small device lithography, for example in the submicrometer (e.g., less than 2.5 micrometer) range.

Figure 4B:
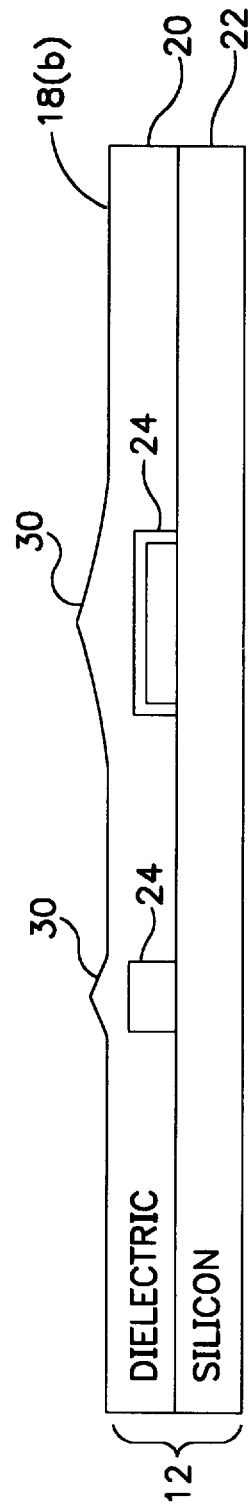
FIG. 4(b) is a schematic representation of the structure of FIG. 4(a) upon completion of a presently known polishing process, illustrating localized non-planarity.

Referring now to FIGS. 4(a) and 4(b), the asperities (e.g., projections) associated with the undersurface of polishing pad 10 contact dielectric surface 20 as surface 20 and pad 10 are moved relative to one another during the polishing process. A chemically and mechanically active slurry or other suitable solution (not shown in FIG. 4) is provided between the mating surfaces of workpiece 12 and pad 10 to facilitate the polishing process. As pad 10 moves relative to workpiece 12, the asperities associated with pad 10, in conjunction with the abrasive particles comprising the slurry, polish down device topographies (ridges) 26, removing material from the ridges in accordance with the chemical and mechanical phenomena associated with the CMP process described above. In particular, the irregular edges which form the surfaces adjoining the cells of pad 10 tend to deflect or bend as they encounter respective leading edges 28 of ridges 26, trapping abrasive particles between the asperities associated with pad 10 and the edges of respective device topographies 26, wearing down respective edges 28 at a faster rate than the device topography surfaces. During the course of the polishing process, ridges 26 are typically worn down until they are substantially co-planar with surface 18; however, it is known that this planarization process is incomplete. Hence, residual nodes or undulations 30 typically remain proximate microstructures 24 upon completion of the planarization process. Although surface 18(b) associated with workpiece 12 is certainly more highly planar upon completion of the CMP process than the surface 18(a) associated with workpiece 12 prior to completion of the planarization process, the existence of nodules can nonetheless be problematic, particularly in future generation integrated circuits wherein extremely high degrees of planarity are desired.

Figure 5A:
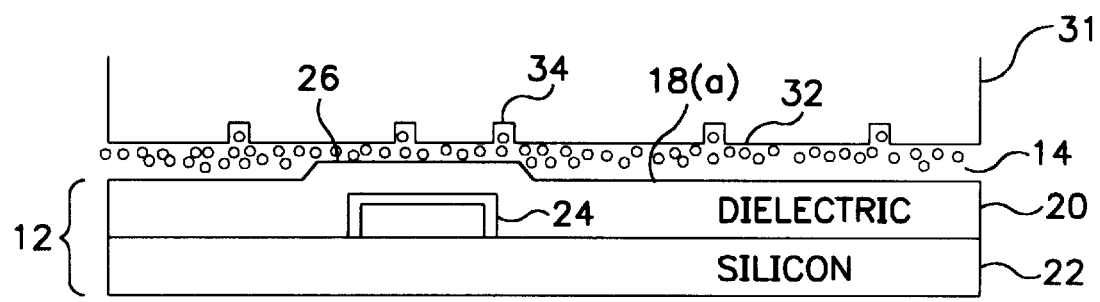
FIG. 5(a) is a schematic cross-section view of a non-cellular pad in accordance with a preferred embodiment of the present invention.

Referring now to FIG. 5, a "lapping" pad 31 is suitably employed in a CMP process in lieu of polishing pad 10. In accordance with a particularly preferred embodiment, pad 31 suitably comprises a substantially flat surface in contact with workpiece 12, characterized by relatively few surface irregularities 34. In particular, surface irregularities 34 may comprise scratches or other non-planarities associated with the dressing of pad 31; alternatively, irregularities 34 may simply result from the welding together of polymers comprising pad 31, e.g., fused polyethylene, non-cellular urethanes, and the like.

In accordance with a further aspect of the present invention, pad 30 is suitably made from a porous material, which permits the adsorption and/or entrainment of suitable slurries, for example, aqueous high pH slurries comprising colloidal silica such as SC1 manufactured by the Cabot Corp. or Deltapol 4101 manufactured by SpeedFam Corporation of Chandler, Arizona, or cerium oxide slurried or low pH alumina slurries. In accordance with yet a further aspect of the present invention, pad 30 may suitably comprise any suitable flat material soft enough to resist damage to fragile integrated circuit device layers, e.g., flexibilized, epoxies. In this regard, it is desirable that pad 30 be desirably relatively pliable to permit the undersurface of pad 31 to conform to the global topography of a workpiece (e.g., wafers) without damaging the delicate microstructures 24 associated with workpiece 12 as pressures are applied between pad 31 and workpiece 12.

Figure 5B:
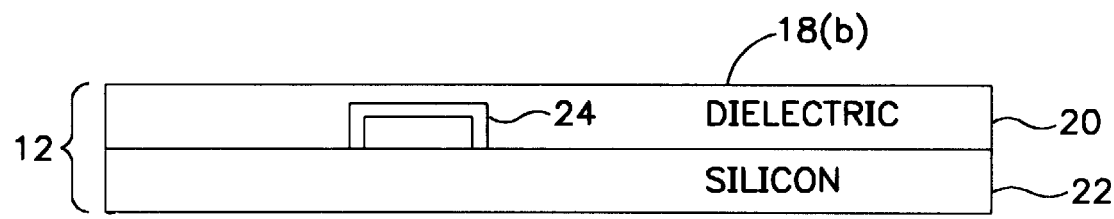
FIG. 5(b) is a schematic cross-section view of the structure of FIG. 5(a) illustrating the enhanced planarity achievable with the substantially flat"lapping" pad of the present invention.

With continued reference to FIG. 5, as pad 31 is moved laterally relative to workpiece 12, the downward force of pad 31 and, hence, the lateral shearing forces created at the interface between workpiece 12 and pad 31 are spread out over a substantially larger surface area than was the case with pad 10. Consequently, substantially higher pressures may be applied between workpiece 12 and pad 31 than could be applied between workpiece 12 and pad 10 (see, FIG. 4) without damaging the surface of workpiece 12 (e.g., microstructures 24). Moreover, the flat surface 32 of pad 31, as opposed to the asperities 16 associated with pad 10, urge particles 14 onto surface 18 more uniformly, thereby resulting in a more uniform planar surface 18(b), as shown in FIG. 5(b). Indeed, the use of a non-cellular or otherwise substantially flat surface associated with pad 31 greatly reduces the step height of the device microstructures associated with planarized surfaces 18(b).

Although the present invention is set forth herein in the context of the appended drawing figures, it should be appreciated that the invention to the specific forms shown. Various other modifications, variations, and enhancements in the design an arrangement of the non-cellular pad and various process parameters discussed herein may be made without departing from the spirit and scope of the present invention as set forth in the appended claims. For example, a preferred embodiment of the present invention is illustrated herein in the context of a dielectric layer over microelectronic structures; however, the present invention may be useful in the context of both multilevel integrated circuits and other small electronic devices, and for fine finishing, flattening and planarization of a broad variety of chemical, electromechanical, electromagnetic, resistive and inductive resistive devices, as well as for the fine finishing, flattening and planarization of optical and electro-optical and mechanical devices. These and other modifications may be made in the design and implementation of various aspects of the invention without departing from the spirit and scope of the invention as set forth in the appended claims.

I claim:

1. A process of chemically and mechanically planarizing a surface of a silicon wafer, comprising the steps of:

providing a non-cellular lapping pad and a polishing slurry which in combination are capable of planarizing the surface of said silicon wafer; and planarizing the surface of said wafer by contacting said lapping pad and the surface of the wafer with sufficient pressure in the presence of said polishing slurry.

2. The process of claim 1, wherein said planarizing step further comprises the step of pressing said lapping pad against the surface of said silicon wafer and relatively moving said pad with respect to the surface of said wafer along a plurality of directions within a plane defined by said pad and said wafer.

3. The process of claim 1, wherein said step of planarizing further comprises the step of pressing the surface of said wafer against said lapping pad and relatively moving the surface of said wafer with respect to said lapping pad along a plurality of directions within a plane defined by said lapping pad and said wafer.

4. The process of claim 1, wherein the polishing slurry includes:

about 5–20% by weight of a chemical agent having a particle size of about 10–200 nanometers selected from the group consisting of a hydroxide and potassium fluoride; and a mechanical agent selected from the group consisting of colloidal silica, cerium oxide and alumina.

5. The process of claim 4, wherein the polishing slurry includes:

about 11% by weight of the chemical agent; and the mechanical agent having a particle size of about 30–80 nanometers.

6. The process of claim 1, wherein the non-cellular lapping pad is constructed from fused polyethylene, flexibilized epoxy or non-cellular urethane.

7. The process of claim 1, wherein the non-cellular lapping pad is constructed from a porous material capable of adsorbing and entraining the polishing slurry.

8. An apparatus for chemically and mechanically planarizing a surface of a silicon wafer, comprising:

first mounting means for mounting said silicon wafer to thereby expose a surface of said silicon wafer; and second mounting means for mounting a non-cellular lapping pad thereto;

wherein said first mounting means is configured to move the exposed surface of said silicon wafer into contact with said lapping pad and press said exposed surface of said wafer against said lapping pad with sufficient pressure in the presence of a polishing slurry.

9. The apparatus of claim 8, wherein the polishing slurry includes:

about 5–20% by weight of a chemical agent having a particle size of about 10–200 nanometers selected from the group consisting of a hydroxide and potassium fluoride; and a mechanical agent selected from the group consisting of colloidal silica, cerium oxide and alumina.

10. The apparatus of claim 9, wherein the polishing slurry includes:

about 11% by weight of the chemical agent; and the mechanical agent having a particle size of about 30–80 nanometers.

11. The apparatus of claim 8, wherein the non-cellular lapping pad is constructed from fused polyethylene, flexibilized epoxy or non-cellular urethane.

12. The apparatus of claim 8, wherein the non-cellular lapping pad is constructed from a porous material capable of adsorbing and entraining the polishing slurry.

13. An apparatus for chemically and mechanically planarizing a surface of a silicon wafer, comprising:

a first mounting plate for mounting a silicon wafer so that a surface of said wafer is exposed;

a second mounting plate having a non-cellular lapping pad attached thereto;

wherein said first and said second mounting plates are configured to move the exposed surface of said wafer into contact with said lapping pad in the presence of a polishing slurry so that the surface of said wafer is planarized.

14. The apparatus of claim 13, wherein said first mounting plate is configured to press the exposed surface of said wafer against said lapping pad and move the exposed surface of said wafer with respect to said lapping pad in at least one direction within a plane defined by said lapping pad and said wafer.

15. The apparatus of claim 13, wherein said second mounting plate is configured to press the lapping pad against the exposed surface of said wafer and move said lapping pad with respect to the exposed surface of said wafer in at least one direction within a plane defined by said lapping pad and said wafer.

16. The apparatus of claim 13, wherein the polishing slurry includes:

about 5–20% by weight of a chemical agent having a particle size of about 10–200 nanometers selected from the group consisting of a hydroxide and potassium fluoride; and a mechanical agent selected from the group consisting of colloidal silica, cerium oxide and alumina.

17. The apparatus of claim 16, wherein the polishing slurry includes:

about 11% by weight of the chemical agent; and the mechanical agent having a particle size of about 30–80 nanometers.

18. The apparatus of claim 13, wherein the non-cellular lapping pad is constructed from fused polyethylene, flexibilized epoxy or non-cellular urethane.

19. The apparatus of claim 13, wherein the non-cellular lapping pad is constructed from a porous material capable of adsorbing and entraining the polishing slurry.

* * * * *

UNITED STATES PATENT AND TRADEMARK OFFICE
CERTIFICATE OF CORRECTION

PATENT NO. : 5,769,691

DATED : June 23, 1998

INVENTOR(S) : Clinton O. Fruitman

It is certified that error appears in the above-identified patent and that said Letters Patent is hereby corrected as shown below:

```
On title page, add item [73] to
         read as follows: --Assignee: SpeedFam Corporation, Chandler, Arizona--
```

Column 3, line 29, the phrase "an ownwardly and impressed" should read --in onwardly impressing abrasive particles 14--. Column 5, line 31, --is not limited-- should be inserted between the words "invention" and "to".

Signed and Sealed this

Twenty-first Day of March, 2000

Attest:

Attesting Officer

Q. TODD DICKINSON

Commissioner of Patents and Trademarks